(12) United States Patent
Gehl et al.

(10) Patent No.: US 9,035,307 B2
(45) Date of Patent: May 19, 2015

(54) MICROPHONE COMPONENT

(71) Applicants: Bernhard Gehl, Wannweil (DE);
Thomas Buck, Pittsburgh, PA (US);
Florian Schoen, Altdorf (DE)

(72) Inventors: Bernhard Gehl, Wannweil (DE);
Thomas Buck, Pittsburgh, PA (US);
Florian Schoen, Altdorf (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/142,360

(22) Filed: Dec. 27, 2013

(65) Prior Publication Data

US 2014/0191233 A1 Jul. 10, 2014

(30) Foreign Application Priority Data

Jan. 4, 2013 (DE) .................. 10 2013 200 070

(51) Int. Cl.
| | |
|---|---|
| *B81B 7/04* | (2006.01) |
| *B81B 7/02* | (2006.01) |
| *H01L 21/66* | (2006.01) |
| *H04R 1/24* | (2006.01) |
| *H04R 19/00* | (2006.01) |
| *H04R 19/04* | (2006.01) |

(52) U.S. Cl.
CPC . *B81B 7/02* (2013.01); *H04R 19/04* (2013.01); *H01L 22/30* (2013.01); *H04R 1/245* (2013.01); *H04R 19/005* (2013.01)

(58) Field of Classification Search
None
See application file for complete search history.

(56) References Cited

U.S. PATENT DOCUMENTS

| 7,863,714 | B2 * | 1/2011 | Diamond et al. | 257/660 |
|---|---|---|---|---|
| 2008/0219482 | A1 * | 9/2008 | Sato | 381/174 |
| 2012/0025897 | A1 | 2/2012 | Wasekura | |
| 2012/0300969 | A1 * | 11/2012 | Tanaka et al. | 381/355 |
| 2012/0328142 | A1 * | 12/2012 | Horibe et al. | 381/355 |
| 2013/0051598 | A1 * | 2/2013 | Reining | 381/355 |
| 2013/0129136 | A1 * | 5/2013 | Harney et al. | 381/355 |
| 2013/0163790 | A1 * | 6/2013 | Shimizu et al. | 381/122 |

FOREIGN PATENT DOCUMENTS

WO WO 2012 025794 3/2012

OTHER PUBLICATIONS

Definition of redundancy downloaded from URL< http://www.merriam-webster.com/dictionary/redundancy > on Oct. 10, 2014.*
Bosch acquires MEMS microphone pioneer Akustica' downloaded from URL <http://www.eetimes.com/document.asp?doc_id=1171584> on Oct. 10, 2014.*

* cited by examiner

*Primary Examiner* — Joseph Schoenholtz
(74) *Attorney, Agent, or Firm* — Kenyon & Kenyon LLP

(57) ABSTRACT

A 2-chip MEMS microphone component includes: at least one first MEMS microphone structural component having at least one first microphone structure formed in the front side of the structural component; an ASIC structural component having evaluation electronics for the microphone signal of the MEMS microphone structural component; and a housing having a sound opening. The MEMS microphone structural component is mounted within the housing and above the sound opening in such a way that the rear side of the microphone structure is acted on by the sound pressure. The ASIC structural component also includes a second MEMS microphone structure whose microphone signal is fed to the evaluation electronics.

9 Claims, 3 Drawing Sheets

MICROPHONE COMPONENT

BACKGROUND OF THE INVENTION

1. Field of the Invention

The present invention relates to a microphone component which includes at least one MEMS microphone structural component having at least one microphone structure formed in the front side of the structural component, an ASIC structural component having evaluation electronics for the microphone signal of the MEMS structural component and a housing having a sound opening. The MEMS microphone structural component is mounted within the housing and above the sound opening, so that the rear side of the diaphragm structure is acted on by the sound pressure.

2. Description of the Related Art

In practice, in particular in applications in the areas of mobile communications and consumer electronics, microphone components are mostly used which are equipped with a specialized MEMS microphone structural component for detecting acoustic signals, and a CMOS ASIC structural component which is independent thereof and is used for processing or evaluating the electrical output signals of the MEMS microphone structural component. According to a standard specification, these two components are combined in a so-called "bottom port" package. For that purpose, the MEMS microphone structural component and the ASIC structural component are mounted side-by-side on a support, which functions as the housing base and has a sound opening. The MEMS microphone structural component is situated above this sound opening. This structure is finally capped with the aid of a lid part which is situated above the two structural components and is connected to the support circumferentially.

Essential for the use of such microphone components in connection with the most varied applications are, on the one hand, the lowest possible manufacturing costs for a small size, and, on the other hand, the best possible microphone performance at the greatest possible frequency range as well as high reliability.

BRIEF SUMMARY OF THE INVENTION

The present invention provides measures for improving the above-described concept of a 2-chip MEMS microphone component, which have a positive impact in particular on the microphone performance and the reliability of the microphone function.

For that purpose, in connection with the 2-chip MEMS microphone component according to the present invention, an ASIC structural component is used, which, in addition to the electric switching functions, also includes a MEMS microphone structure. The microphone signal of this second microphone component is fed to the evaluation electronics in the same way as the microphone signal of the MEMS microphone structural component. Accordingly, the microphone component, according to the present invention, thus includes two MEMS microphone components, that of the MEMS microphone structural component and that of the ASIC structural component, which deliver a microphone signal independent of one another.

In a first variant of the signal processing in the ASIC structural component, these two microphone signals, which are independent of one another, may be used to increase the reliability of the microphone component. For that purpose, the output signal of the microphone component may, for example, be based on the output signal of the MEMS microphone structural component, for example, by default until a signal error occurs which makes it possible to infer a failure of the MEMS microphone structural component. Thereafter, the microphone signal of the other microphone component may still be used as a basis for the output signal of the microphone component.

However, the redundancy of the two microphone signals may also be used to continuously monitor the functionality of the microphone component, that is, during the use of such a component as part of an application and during the entire life of the component. For that purpose, the microphone signals or parameters, which are ascertained from the microphone signals in the context of the signal processing, are compared with one another, which makes it possible to draw inferences concerning the functionality of the individual structural components.

In one preferred specific embodiment of the present invention, the microphone component includes two MEMS microphone components, the characteristic behavior of which differs significantly. This is advantageous in such a way that the two components have complementary microphone properties. This makes it possible to specifically expand the functionality of the microphone component. In a component according to the present invention, for example, a MEMS microphone structural component, which is equipped with a very high sensitivity or with a very high SNR, may be combined with a MEMS microphone component on the ASIC structural component, in which a very high overload limit (SPL) is implemented. It is very difficult to implement these two properties in a single MEMS microphone component. The combination of two MEMS microphone components having different characteristic behavior, however, also makes it possible to enlarge the frequency range of the microphone component in a simple way, in that it is possible to detect the acoustic signals using a predetermined sensitivity. In this connection, in particular there is also the option of using the MEMS microphone structural component for the acoustic range, i.e., a frequency range of approximately 16 Hz to approximately 20 kHz and covering the ultrasound range of approximately 20 kHz to approximately 100 kHz using the MEMS microphone structure of the ASIC structural component.

In one preferred specific embodiment of the present invention, the microphone component of the MEMS microphone structural component and/or the microphone component of the ASIC structural component may also be activated and used as a sound source for calibrating the other microphone component. In this case, a defined acoustic signal is generated using one microphone component, the signal subsequently being measured by the other microphone component. In this way, the two microphone components may be calibrated automatically, for example, at regular intervals during the life of the component.

At this point, it should also be noted that the ASIC structural component may also include additional micromechanical sensor components, such as an absolute pressure sensor component for detecting the internal pressure of the housing.

The standard specification of a microphone component of the type discussed here provides only one sound opening in the housing. The housing of a microphone component according to the present invention should, for that reason, also have only one sound opening so it may be used in as versatile a way as possible. In this case, both MEMS microphone components must be connected to the one sound opening in the housing. In one preferred specific embodiment of the present invention, the MEMS microphone structural component is mounted for that purpose—as in the related art— above the sound opening, while the MEMS microphone structure of the ASIC structural component is connected to this sound opening via a pressure channel. If the MEMS microphone structure is formed in the front side of the ASIC structural component and if the ASIC structural component, like the MEMS microphone structural component, is mounted face-up next to it on a support of the housing, in which the sound opening is formed, this pressure channel is advantageously limited, on the one hand, by the support and, on the other hand, by a section of the rear side of the MEMS microphone structural component and a section of the rear side of the ASIC structural component. This package concept is compatible with the standard specification of bottom-port microphones, such as those frequently used in practice. The pressure channel may be implemented in the form of a trench structure in the support upper surface and/or in the form of a trench structure in the rear side of the MEMS microphone structural component and/or in the rear side of the ASIC structural component.

DETAILED DESCRIPTION OF THE INVENTION

The drawings illustrate that the microphone component according to the present invention is based on a modular structural concept.

Figure 1:
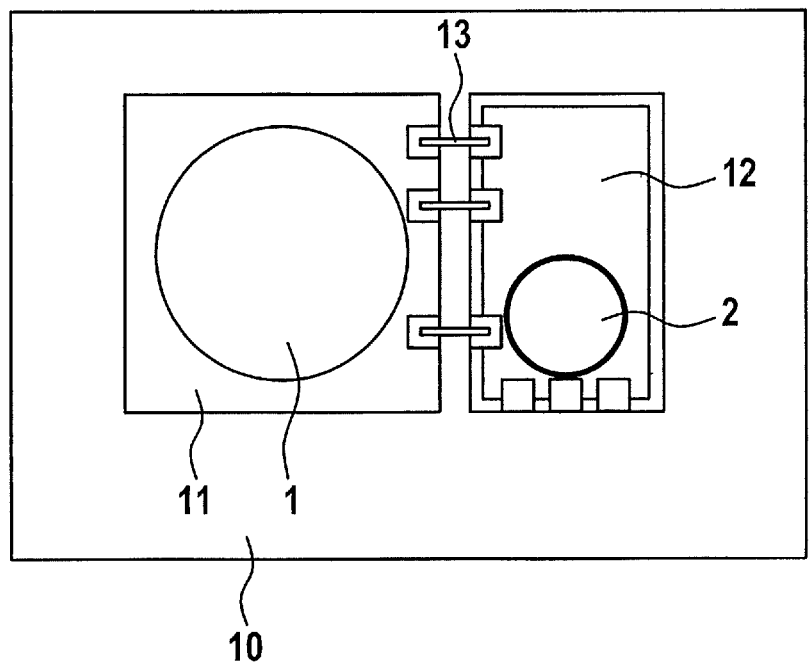
FIG. 1 shows a top view of the equipped structural component support of a first microphone component according to the present invention.

Structural component support 10 of a microphone component according to the present invention shown in FIG. 1, together with a lid part, which is not shown here, forms a housing for two structural components 11 and 12 which are designed and manufactured independently of one another.

Structural component 11 is a MEMS microphone structural component 11 having a microphone structure 1 formed in the front side of the structural component, the microphone structure including a circular microphone diaphragm in the exemplary embodiment represented here. MEMS microphone structural component 11 is mounted face-up on structural component support 10, and in particular above a sound opening in structural component support 10, so that the rear side of microphone structure 1 is acted on by the sound pressure. Consequently, this sound opening is not apparent in the top view of FIG. 1, since it is covered by MEMS microphone structural component 11.

An ASIC structural component 12 having evaluation electronics is situated on structural component support 10 laterally adjacent to MEMS microphone structural component 11, the microphone signal of MEMS microphone structural component 11 being fed to the evaluation electronics via electrical connections 13. In addition to the circuit components of the evaluation electronics, ASIC structural component 12 includes, according to the present invention, a separate MEMS microphone structure 2 having—in this case as well—a circular microphone diaphragm which is formed in the front side of the structural component. ASIC structural component 12 is, similar to MEMS microphone structural component 11, mounted face-up on structural component support 10, so that MEMS microphone structure 2 including the microphone diaphragm is located above a second—also not apparent in FIG. 1—sound opening in structural component support 10. Accordingly, sound also acts on the rear side of this microphone structure. The microphone signal of this second MEMS microphone structure 2 is fed to the evaluation electronics of ASIC structural component 12 in the same way as the microphone signal of MEMS microphone structural component 11. This makes it possible for both microphone signals to be processed or evaluated separately or together.

Figure 2A:
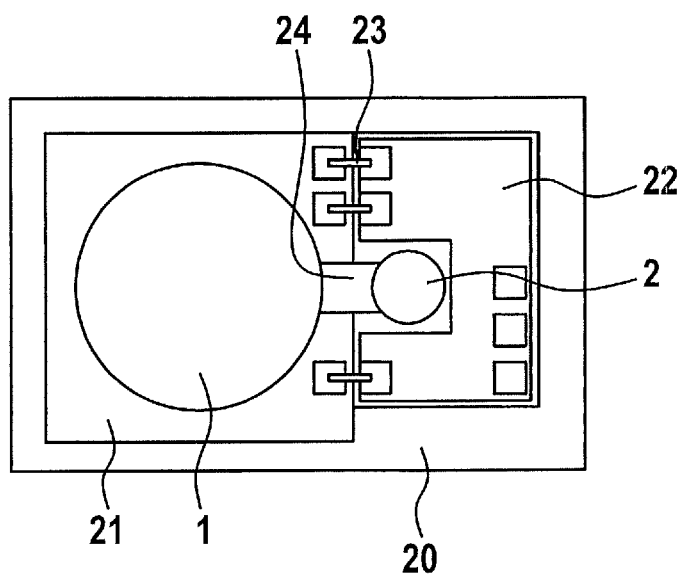
FIG. 2a shows a top view of the equipped structural component support of a second microphone component according to the present invention.
Figure 2B:
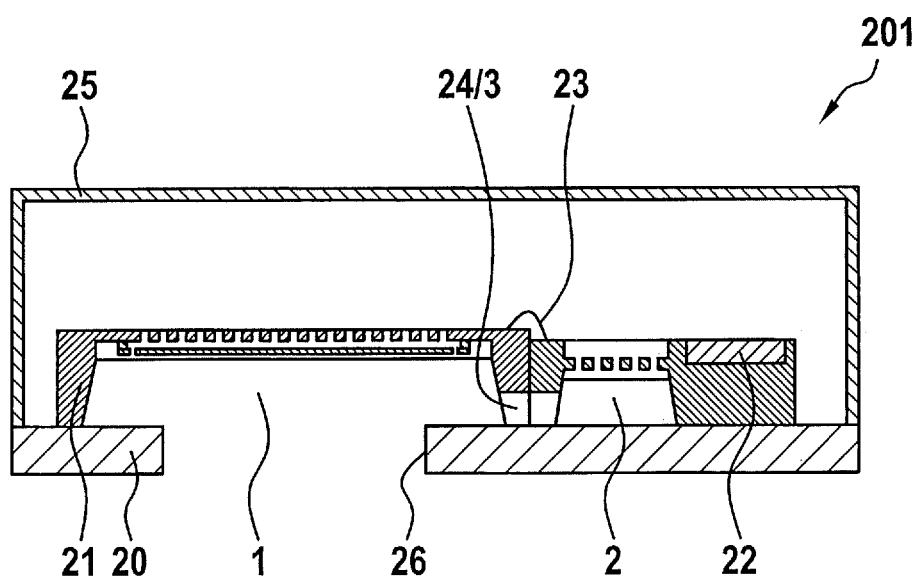
FIGS. 2b-2d each show the schematic cross section of a microphone component 201, 202 and 203 having different forms of implementing a pressure connection of the two MEMS microphone components to the sound opening in the structural component support.
Figure 2C:
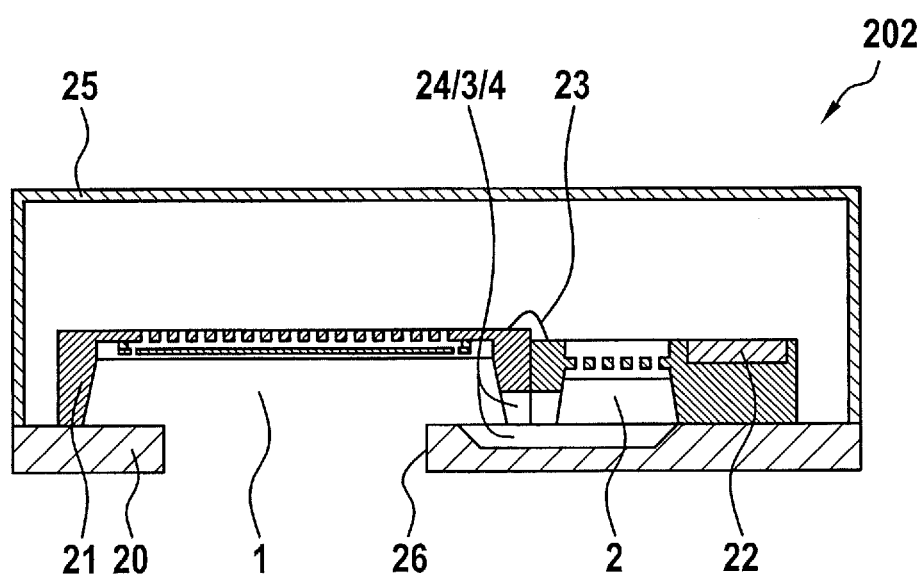
Figure 2D:
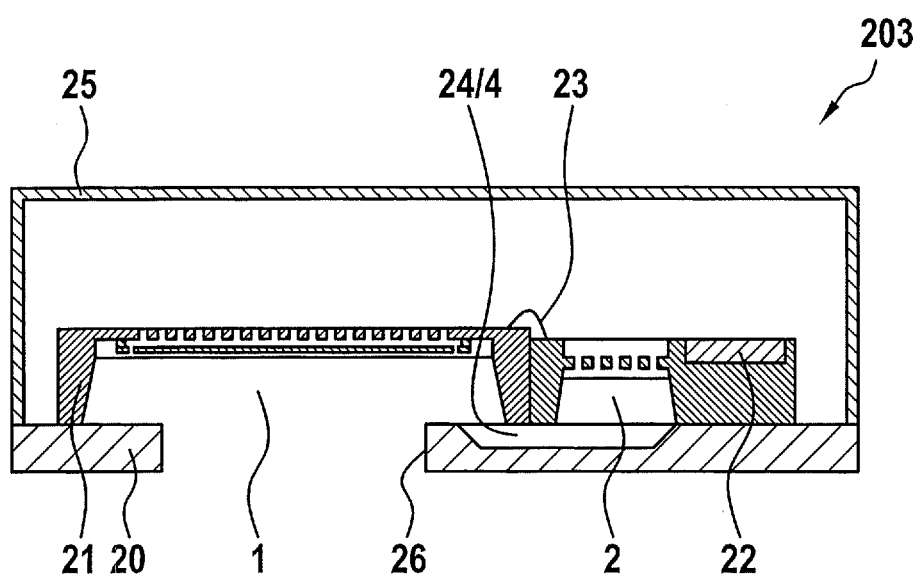

Structural component support 20 of one preferred specific embodiment of the microphone component according to the present invention, which is represented in FIG. 2a, is also a component of a housing for a MEMS microphone structural component 21 and an ASIC structural component 22 having evaluation electronics and a second microphone component. In addition to structural component support 20, the housing also includes a lid, part 25, which is situated above both components 21 and 22 on structural component support 20 and is circumferentially connected to it, which is represented in FIGS. 2b, 2c and 2d. In contrast to the first exemplary embodiment described above, structural component support 20 is, in this case, equipped with only one sound opening 26.

The actual microphone function of the microphone component is fulfilled by MEMS microphone structural component 21, whose microphone structure 1 is significantly larger in the upper surface of the structural component than microphone structure 2 in the upper surface of ASIC structural component 22. The microphone components of both components 21 and 22 have different microphone properties, which advantageously complement one another. Both components 21 and 22 are interconnected via electrical connections 23, so that the microphone signals of both microphone components may be processed either separately or together with the aid of the evaluation electronics of ASIC structural component 22.

MEMS microphone component 21 is mounted face-up above single sound opening 26 in structural component support 20, so that sound acts on the rear side of microphone structure 1. ASIC structural component 22 is also mounted face-up on structural component support 20, in particular directly adjacent to MEMS microphone structural component 21. A pressure channel 24, through which the sound pressure reaches microphone structure 2 of ASIC structural component 22, is formed between the sound opening in structural component support 20 or the space under microphone structure 1 of MEMS microphone structural component 21 and the space between structural component support 20 and microphone structure 2 of ASIC structural component 22. In contrast to the first exemplary embodiment, no second sound opening is, in this case, required in structural component support 20.

In FIGS. 2b, 2c and 2d are represented three microphone components 201, 202 and 203 having a structural component support 20, which—as described in connection with FIG. 2a—is equipped with structural components 21 and 22 and only has one sound opening 26 for both microphone components. Microphone components 201, 201 and 203 differ only in the implementation of pressure channel 24 between the space under microphone structure 1 of MEMS microphone structural component 21 and the space between structural component support 20 and microphone structure 2 of ASIC structural component 22. In all three specific embodiments, MEMS microphone structural component 21 and ASIC structural component 22 are not only mounted pressure-tight on structural component support 20, but are also connected pressure-tight laterally to one another.

In the case of microphone component 201, represented in FIG. 2b, pressure channel 24 in the form of a trench, structure 3, is implemented in the rear sides of MEMS microphone structural component 21 and of ASIC structural component 22, and is limited on the support side by the unstructured flat surface of structural component support 20. In the case of microphone component 202, represented in FIG. 2c, pressure channel 24 is formed in the surface of structural component support 20 by a trench, structure 3, in the rear sides of MEMS microphone structural component 21 and of ASIC structural component 22 in connection with a recess 4 or trench structure situated and formed to overlap it.

And in the case of microphone component 203 represented in FIG. 2d, the rear sides of MEMS microphone structural component 21 and of ASIC structural component 22 are only structured in the area of microphone structures 1 and 2. Pressure channel 24 is implemented here in the form of a trench structure 4, in the upper surface of structural component support 20 and is closed by the rear sides of structural components 21 and 22.

What is claimed is:

1. A microphone component, comprising:
    a first MEMS microphone structural component having at least one first microphone structure formed in a front side of the structural component;
    an ASIC structural component having evaluation electronics for a microphone signal of the first MEMS microphone structural component; and
    a housing having a sound opening;
    wherein the first MEMS microphone structural component is mounted within the housing and above the sound opening such that that a rear side of the first microphone structure is acted on by the sound pressure, and wherein the ASIC structural component includes a second MEMS microphone structure, and wherein a microphone signal of the second MEMS microphone structure is fed to the evaluation electronics.

2. The microphone component as recited in claim 1, wherein the evaluation electronics compares the microphone signals of the first MEMS microphone structural component and of the second MEMS microphone structure of the ASIC structural component in order to monitor the functionality of the microphone component.

3. The microphone component as recited in claim 2, wherein the second MEMS microphone structure of the ASIC structural component has at least one of (i) a different microphone sensitivity than the first MEMS microphone structural component in at least one frequency range, and (ii) a different overload limit than the first MEMS microphone structural component.

4. The microphone component as recited in claim 3, wherein the first MEMS microphone structural component is configured for an input sonic frequency of approximately 16 Hz to 20 kHz, and wherein the second MEMS microphone structure of the ASIC structural component is configured for an input sonic frequency range of approximately 20 kHz to 100 kHz.

5. The microphone component as recited in claim 4, wherein at least one of the first microphone component of the first MEMS microphone structural component and the second microphone component of the ASIC structural component is configured to be activated as a sound source for calibrating a respective other microphone component.

6. The microphone component as recited in claim 2, wherein the ASIC structural component includes an absolute pressure sensor component for detecting an internal pressure of the housing.

7. The microphone component as recited in claim 2, wherein the second MEMS microphone structure of the ASIC structural component is connected via a pressure channel to the sound opening in the housing.

8. The microphone component as recited in claim 7, wherein:
    the second MEMS microphone structure is formed in a front side of the ASIC structural component;
    the ASIC structural component is mounted face-up and adjacent to the first MEMS microphone structural component on a support of the housing; and
    the pressure channel is limited by (i) the support and (ii) a section of the rear side of the first MEMS microphone structural component and a section of the rear side of the ASIC structural component.

9. The microphone component as recited in claim 8, wherein the pressure channel is in the form of a trench structure in at least one of (i) the support upper surface, (ii) the rear side of the first MEMS microphone structural component, and (iii) the ASIC structural component.

* * * * *